(12) United States Patent
Lo et al.

(10) Patent No.: US 11,087,686 B2
(45) Date of Patent: Aug. 10, 2021

(54) ELECTRONIC DEVICE

(71) Applicant: Innolux Corporation, Miao-Li County (TW)

(72) Inventors: Min-Hsin Lo, Miao-Li County (TW); Hung Sheng Liao, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/004,026

(22) Filed: Aug. 27, 2020

(65) Prior Publication Data

US 2021/0082345 A1 Mar. 18, 2021

Related U.S. Application Data

(60) Provisional application No. 62/899,213, filed on Sep. 12, 2019.

(30) Foreign Application Priority Data

Jul. 6, 2020 (CN) .......................... 202010639181.8

(51) Int. Cl.
*G09G 3/3233* (2016.01)
(52) U.S. Cl.
CPC ... *G09G 3/3233* (2013.01); *G09G 2300/0426* (2013.01)

(58) Field of Classification Search
CPC ..................... G09G 3/3233; G09G 2300/0426
See application file for complete search history.

(56) References Cited

U.S. PATENT DOCUMENTS

| 2005/0275352 | A1 | 12/2005 | Sun |
| 2015/0108437 | A1 | 4/2015 | Cho et al. |
| 2018/0204889 | A1* | 7/2018 | Yu ....................... H01L 27/3276 |

* cited by examiner

*Primary Examiner* — Stacy Khoo
(74) *Attorney, Agent, or Firm* — JCIPRNET

(57) ABSTRACT

The disclosure provides an electronic device. The light emitting pixel included in the electronic device includes a light emitting unit, a driving transistor, and a storage capacitor. The driving transistor is configured to control the driving current passing through the light emitting unit. The storage capacitor is electrically connected to the driving transistor and includes a first conductive layer and a second conductive layer. The first conductive layer and the second conductive layer are electrically isolated from each other. The first conductive layer includes a plurality of first main portions connected through at least one first connection portion, and the second conductive layer includes a plurality of second main portions connected through at least one second connection portion. In the top view of the light emitting pixel, one of the first main portions overlaps one of the second main portions.

20 Claims, 7 Drawing Sheets

ELECTRONIC DEVICE

CROSS-REFERENCE TO RELATED APPLICATION

This application claims the priority benefits of U.S. provisional application Ser. No. 62/899,213, filed on Sep. 12, 2019, and China application serial no. 202010639181.8, filed on Jul. 6, 2020. The entirety of each of the above-mentioned patent applications is hereby incorporated by reference herein and made a part of this specification.

BACKGROUND

Field of the Disclosure

The disclosure relates to a structure of an electronic device, particularly to a light emitting pixel structure of a panel in the electronic device.

Description of Related Art

As the applications of electronic devices continue to increase, technologies related to panels provided in electronic devices are constantly improved, and the yield of light emitting pixels in the panel is always an important issue.

SUMMARY OF THE DISCLOSURE

The disclosure provides a light emitting pixel in an electronic device with better yield.

According to the embodiment of the disclosure, a light emitting pixel of an electronic device includes a light emitting unit, a driving transistor, and a storage capacitor. The driving transistor is configured to control the driving current passing through the light emitting unit. The storage capacitor is electrically connected to the driving transistor and includes a first conductive layer and a second conductive layer. The first conductive layer and the second conductive layer are electrically isolated from each other. The first conductive layer includes a plurality of first main portions connected through at least one first connection portion, and the second conductive layer includes a plurality of second main portions connected through at least one second connection portion. In the top view of the light emitting pixel, one of the first main portions overlaps one of the second main portions.

In order to make the above-mentioned features and advantages of the disclosure more comprehensible, the embodiments are specifically described below in detail with reference to the accompanying drawings.

BRIEF DESCRIPTION OF THE DRAWINGS

The drawings are incorporated to facilitate understanding of the disclosure, and the drawings are incorporated in and constitute a part of this specification. The drawings illustrate the embodiments of the disclosure, and together with the description serve to explain the principles of the disclosure.

DESCRIPTION OF EMBODIMENTS

Figure 1:
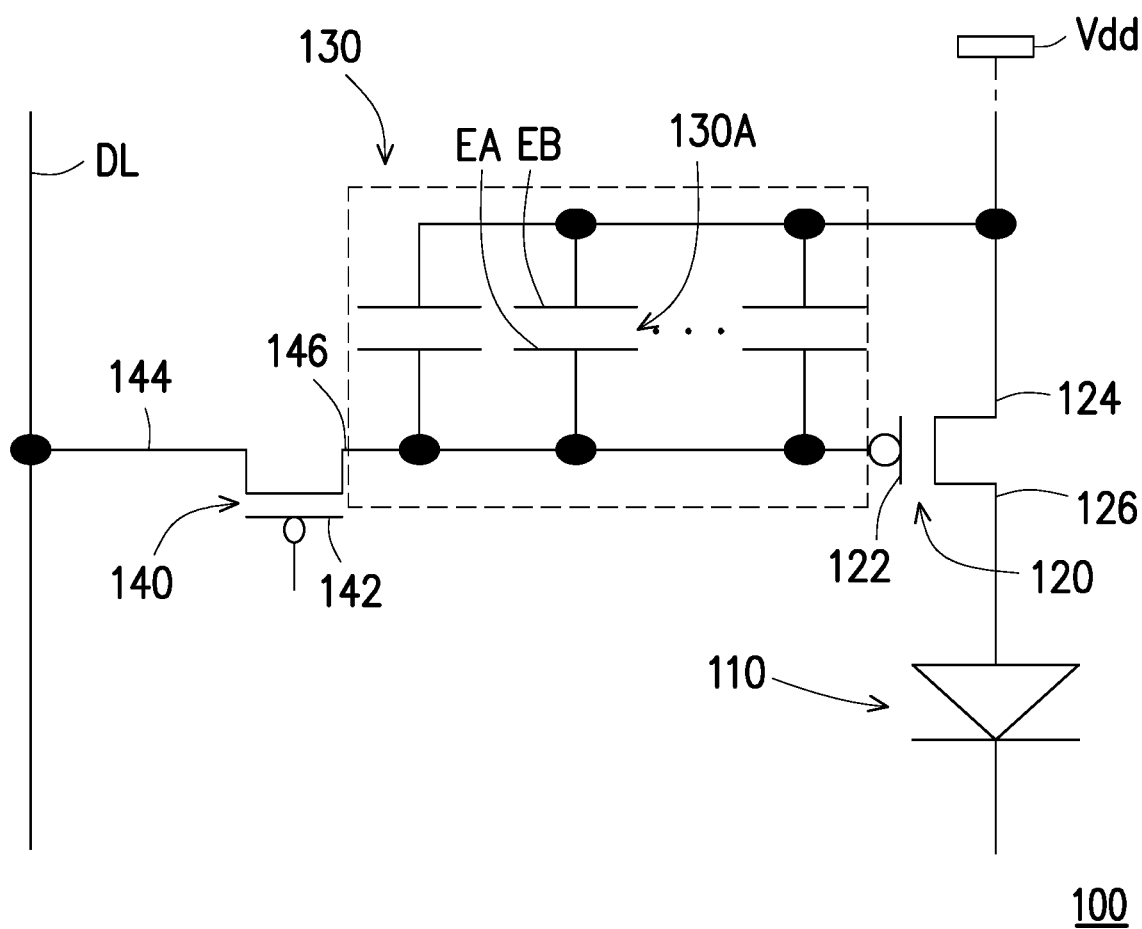
FIG. 1 is a schematic circuit diagram of a light emitting pixel according to an embodiment of the disclosure.

Reference will now be made in detail to the exemplary embodiments of the disclosure, examples of which are illustrated in the drawings. Wherever possible, the same reference symbols are used in the drawings and descriptions to denote the same or similar parts.

If one structure (or layer, component, substrate) described in this disclosure is located on/above another structure (or layer, component, substrate), it can mean that the two structures are adjacent to each other and directly connected, or it can mean that the two structures are adjacent to each other but not directly connected. The indirect connection means that there is at least one intermediate structure (or intermediate layer, intermediate component, intermediate substrate, intermediate space) between the two structures, and the lower surface of a structure is adjacent to or directly connected to the upper surface of the intermediate structure, and the upper surface of another structure is adjacent to or directly connected to the lower surface of the intermediate structure. The intermediate structure can be composed of single-layer or multi-layer physical structures or non-physical structures, the disclosure provides no limitation thereto. In this disclosure, when a structure is arranged "on" another structure, it may mean that the structure is "directly" located on the other structure, or that the structure is "indirectly" located on the other structure, that is, there is at least one structure provided between the structure and other structures.

The electrical connection or coupling described in this disclosure can refer to direct connection or indirect connection. In the case of direct connection, the endpoints of the components on two circuits are directly connected or connected to each other through a conductor line. In the case of indirect connection, there are switches, diodes, capacitors, inductors, resistors, other suitable components, or a combination of the above components between the endpoints of the components on two circuits, the disclosure provides no limitation thereto.

It should be noted that, in the following embodiments, the technical features of several different embodiments can be replaced, recombined, and mixed to achieve other embodiments without departing from the spirit of the disclosure. As long as the features in the different embodiments do not violate the spirit of the disclosure or in conflict with each other, they can be mixed and used freely.

FIG. 1 is a schematic circuit diagram of a light emitting pixel according to an embodiment of the disclosure. In FIG. 1, the light emitting pixel 100 can be applied to any electronic device that needs to emit light to achieve a desired function. The electronic device may include a display device, an antenna device, a sensing device, or a tiled device, but the disclosure provides no limitation thereto. In addition, the electronic device may also be a bendable or flexible electronic device. The electronic device may include, for example but not limited to, light emitting diode (LED). The light emitting diode may include, for example, organic light emitting diode (OLED), mini light emitting diode (mini LED), micro light emitting diode (micro LED) or quantum dot light emitting diode (QLED or QDLED) and other types of LED, or contain fluorescent material, phosphor, others suitable materials or any combination of the above materials, but the disclosure provides no limitation thereto. The antenna device may be, for example, a liquid crystal antenna, but is not limited thereto. The tiled device may be, for example, a display tiled device or an antenna tiled device, but is not limited thereto. It should be noted that the electronic device may be any combination of the foregoing facilities, but is not limited thereto.

The light emitting pixel 100 includes a light emitting unit 110, a driving transistor 120, and a storage capacitor 130. The driving transistor 120 is configured to control whether the light emitting unit 110 can be electrically connected to the power supply Vdd. In other words, the driving transistor 120 is configured to control the driving current passing through the light emitting unit 110. The storage capacitor 130 is electrically connected to the driving transistor 120. In some embodiments, the driving transistor 120 is, for example, a three-terminal element, wherein the storage capacitor 130 is electrically connected between the first terminal 122 and the second terminal 124 of the driving transistor 120. The second terminal 124 of the driving transistor 120 can be electrically connected to the power supply Vdd, and the light emitting unit 110 is electrically connected to the third terminal 126 of the driving transistor 120. When the signal received by the first terminal 122 of the driving transistor 120 is an on signal, the second terminal 124 and the third terminal 126 of the driving transistor 120 can be turned on, and the light emitting unit 110 is allowed to be electrically connected to the power supply Vdd to emit light. In some embodiments, the light emitting unit 110 may be a light emitting diode, such as one of the aforementioned types of light emitting diodes, but not limited thereto.

In this embodiment, the storage capacitor 130 may include a plurality of capacitor portions 130A, and one of the capacitor portions 130A includes an electrode EA and an electrode EB. The electrode EA and the electrode EB may be arranged opposite to each other, and a dielectric layer is provided between the electrode EA and the electrode EB, which are spaced apart to form a capacitor structure. The electrode EA of the capacitor portion 130A may be electrically connected to the first terminal 122 of the driving transistor 120, and the electrode EB of the capacitor portion 130A may be electrically connected to the second terminal 124 of the driving transistor. In addition, the light emitting pixel 100 may further include a switching transistor 140, and the electrode EA of the capacitor portion 130A is, for example, electrically connected between the switching transistor 140 and the driving transistor 120, but the disclosure is not limited thereto. The first terminal 142 of the switching transistor 140 can be configured to receive scan signals, the second terminal 144 of the switching transistor 140 can be electrically connected to the data line DL, and the third terminal 146 of the switching transistor 140 can be electrically connected to the first terminal 122 of the driving transistor 120. In this manner, the switching transistor 140 can be configured to control whether the first terminal 122 of the driving transistor 120 receives data signals from the data line DL.

In some embodiments, the operation of the light emitting pixel 100 may include a scan stage and a light emitting stage. In the scan stage, the first terminal 142 of the switching transistor 140 can be input with a scan signal to turn on the switching transistor 140, and the data signal on the data line DL can be transmitted to the first terminal 122 of the driving transistor 120 through the turned-on switching transistor 140. In the light emitting stage, the driving transistor 120 can be turned on after the first terminal 122 receives the data signal to allow the light emitting unit 110 to be electrically connected to the power supply Vdd, and the light emitting unit 110 emits light due to the driving current that passes therethrough. In addition, the storage capacitor 130 can maintain the voltage on the first terminal 122 of the driving transistor 120 to enable the light emitting unit 110 to emit light stably. The above mentioned light emitting operation is for illustrative purposes only, and this disclosure is not limited thereto. In other embodiments, the relevant circuit elements for controlling the driving transistor 120 may include more transistors, more capacitors, or other circuit elements.

Figure 2:
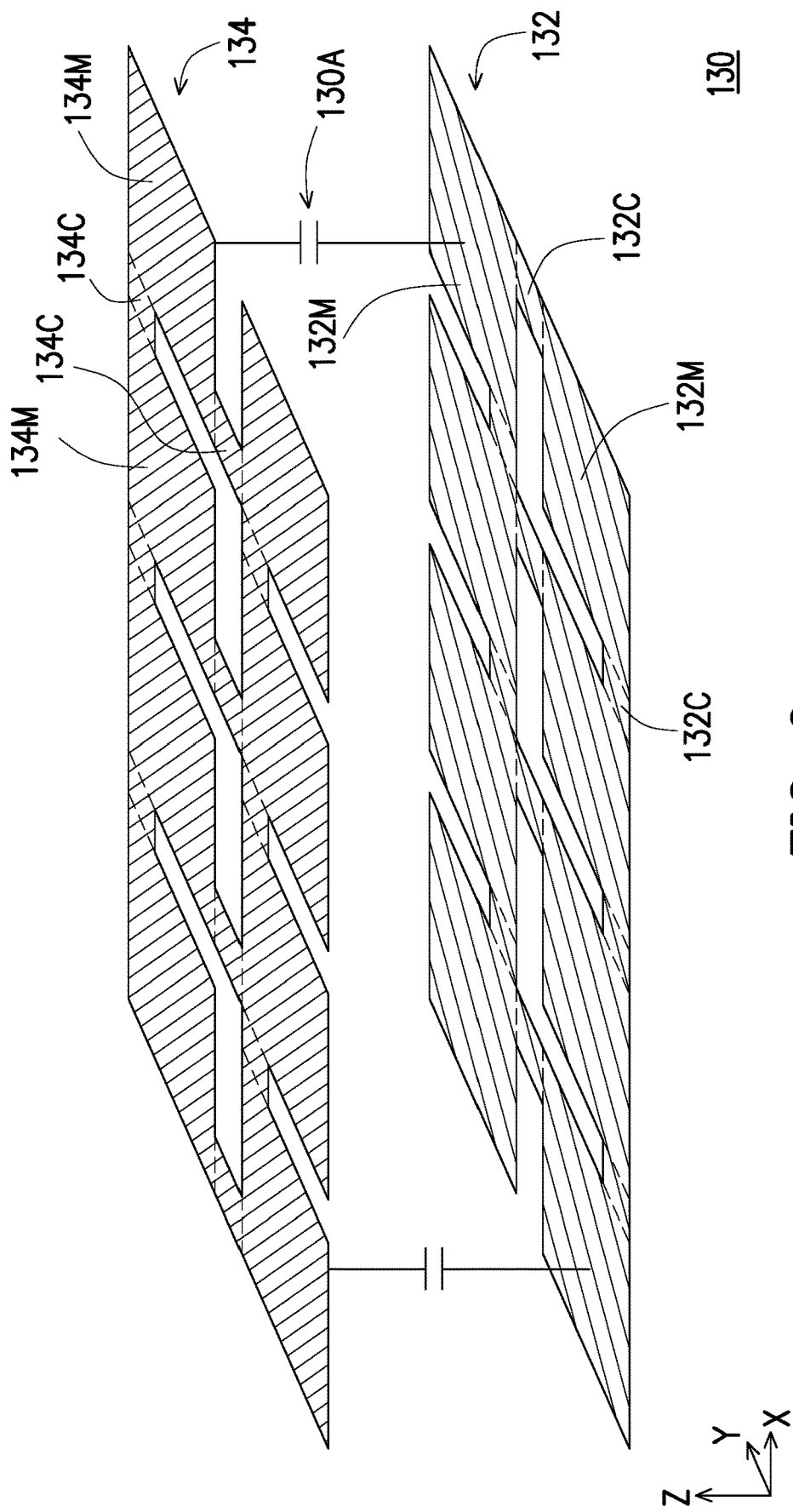
FIG. 2 is a schematic view showing the structure of a storage capacitor according to an embodiment of the disclosure.

FIG. 2 is a schematic view showing the structure of a storage capacitor according to an embodiment of the disclosure. The structure of the storage capacitor in FIG. 2 can be regarded as an implementation of the storage capacitor in the light emitting pixel in FIG. 1, but the disclosure is not limited thereto. In FIG. 2, the storage capacitor 130 includes a first conductive layer 132 and a second conductive layer 134, and the first conductive layer 132 and the second conductive layer 134 are electrically isolated from each other. In some embodiments, one or more insulating layers may be disposed between the first conductive layer 132 and the second conductive layer 134 to ensure that the first conductive layer 132 and the second conductive layer 134 are electrically isolated from each other. The first conductive layer 132 and the second conductive layer 134 are patterned to define a plurality of capacitor portions 130A. For example, the first conductive layer 132 may include a plurality of first main portions 132M connected through at least one first connection portion 132C, and the second conductive layer 134 may include a plurality of second main portions 134M connected through at least one second connection portion 134C. One first main portion 132M and one of the second main portions 134M can be parts of a capacitor portion 130A.

Each of the first conductive layer 132 and the second conductive layer 134 is, for example, a conductive layer distributed on the X-axis-Y-axis plane, and the first conductive layer 132 and the second conductive layer 134 are separated from each other on the Z axis. The plurality of first main portions 132M in the first conductive layer 132 are arranged side by side in a 2×4 array, for example, on the X-axis-Y-axis plane, and the plurality of second main portions 134M in the second conductive layer 134 are arranged side by side in a 2×4 array, for example, on the X-axis-Y-axis plane. However, in the disclosure, the shape, number and arrangement of the first main portion 132M and the second main portion 134M are not limited thereto. In the top view of the light emitting pixel, that is, when viewing the light emitting pixel along the Z axis, one of the plurality of first main portions 132M may overlap one of the plurality of second main portions 134M. In other words, one first main portion 132M and one of the second main portions 134M can be arranged in pairs (overlapping each other) to [ul] be parts of one of the capacitor portions 130A. Moreover, the first main portion 132M can be regarded as one of the electrode EA and electrode EB in FIG. 1, and the second main portion 134M can be regarded as the other of the electrode EA and the electrode EB in FIG. 1. In FIG. 2, for clarity, the capacitor portion 130A is only shown at the corner, but in fact, a pair of the first main portion 132M and the second main portion 134M can be parts of a capacitor portion 130A. Taking the structure of FIG. 2 as an example, FIG. 2 shows, for example, eight pairs of the first main portion 132M and the second main portion 134M, and therefore eight capacitor portions 130A can be formed. However, the number of capacitor portions 130A that can be formed by the first conductive layer 132 and the second conductive layer 134 may be different due to different structural designs, and this disclosure is not limited thereto.

Figure 3:
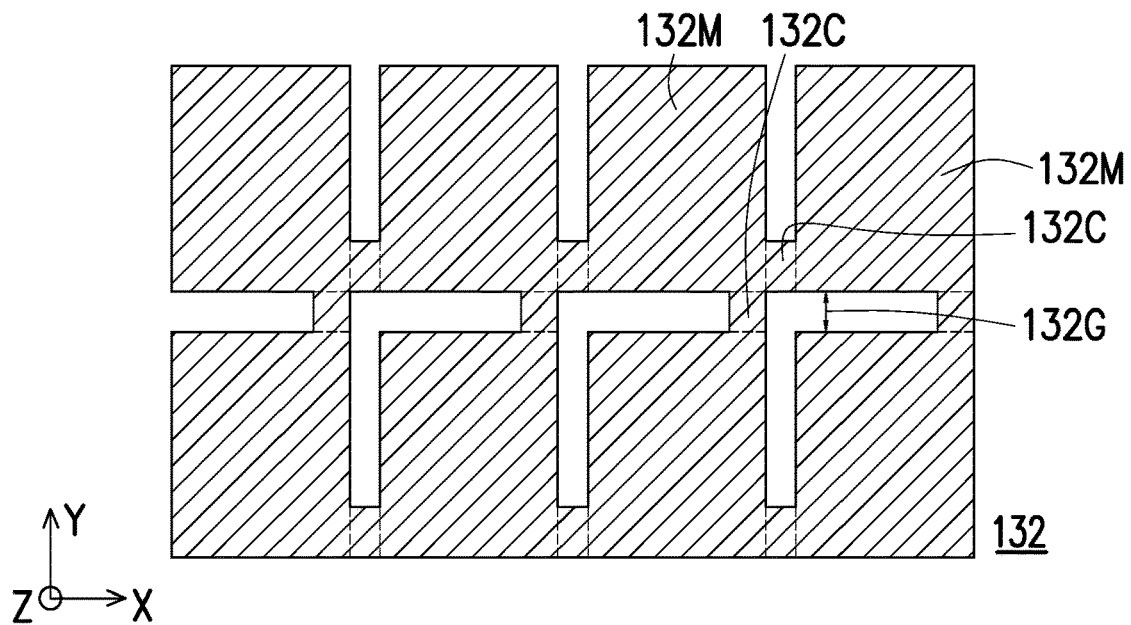
FIG. 3 is a schematic view of the first conductive layer of the storage capacitor of FIG. 2 in a top view of a light emitting pixel.

FIG. 3 is a schematic view of the first conductive layer 132 of the storage capacitor of FIG. 2 in a top view of a light emitting pixel. Referring to FIG. 2 and FIG. 3 both, the first conductive layer 132 includes a plurality of first main portions 132M connected through at least one first connection portion 132C. In this embodiment, each first main portion 132M has a substantially rectangular pattern in the top view, that is, viewed in the Z-axis direction, but this disclosure is not limited thereto. The plurality of first main portions 132M are arranged in an array on a X-axis-Y-axis plane, and the adjacent two of the first main portions 132M are spaced apart by a first space 132G. At least one first connection portion 132C may be disposed in the first space 132G, and the adjacent two of the first main portions 132M are connected through the first connection portion 132C. A first main portion 132M can be connected to one adjacent first main portion 132M in the X-axis direction and can also be connected to another adjacent first main portion 132M in the Y-axis direction. As such, adjacent two of the plurality of first main portions are connected through the at least one first connection portion. In addition, the first main portion 132M and the first connection portion 132C can be obtained by patterning the same layer of conductive material, but this disclosure is not limited thereto.

Figure 4:
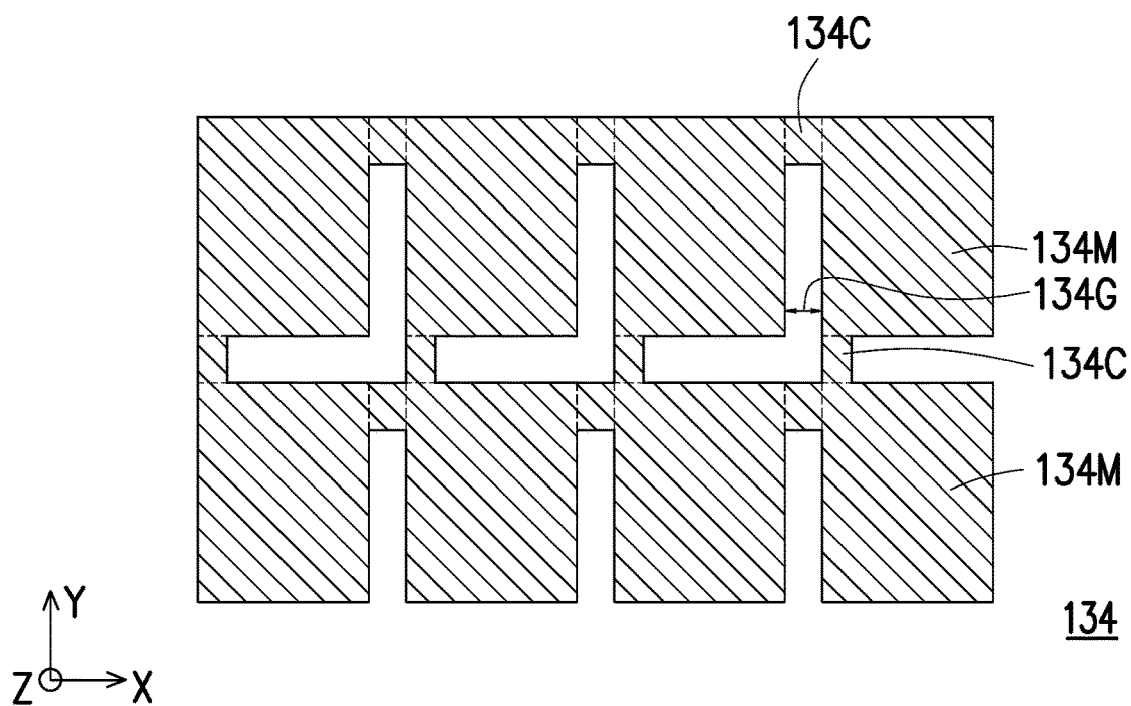
FIG. 4 is a schematic view of the second conductive layer of the storage capacitor in FIG. 2 in a top view of a light emitting pixel.

FIG. 4 is a schematic view of the second conductive layer 134 of the storage capacitor in FIG. 2 in a top view of a light emitting pixel. Referring to FIG. 2 and FIG. 4 together, the second conductive layer 134 includes a plurality of second main portions 134M connected through at least one second connection portion 134C. In this embodiment, one second main portion 134M has a substantially rectangular pattern when viewed in a top view of the light emitting pixel, that is, viewed in the Z-axis direction, but this disclosure is not limited thereto. The plurality of second main portions 134M are arranged in an array on the X-axis-Y-axis plane, and the adjacent two of the second main portions 134M are spaced apart by a second space 134G. At least one second connection portion 134C may be disposed in the second space 134G, and the adjacent two of the second main portions 134M are connected through the second connection portion 134C. A second main portion 134M may be connected to one adjacent second main portion 134M in the X-axis direction, and may also be connected to another adjacent second main portion 134M in the Y-axis direction. As such, adjacent two of the plurality of second main portions are connected through the at least one second connection portions. In addition, the second main portion 134M and the second connection portion 134C can be obtained by patterning the same layer of conductive material, but this disclosure is not limited thereto.

Figure 5:
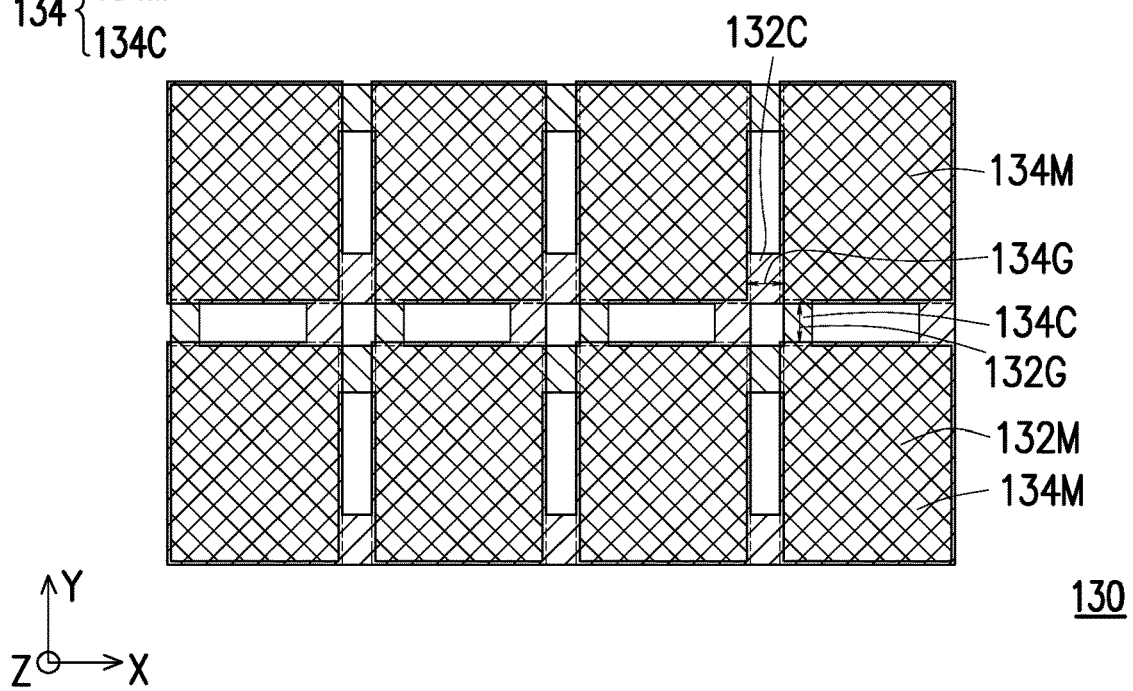
FIG. 5 is a schematic view of the storage capacitor of FIG. 2 in a top view of a light emitting pixel.

FIG. 5 is a schematic view of the storage capacitor 130 of FIG. 2 in a top view of a light emitting pixel. Please refer to FIG. 2 and FIG. 5. In this embodiment, the first conductive layer 132 may be located under the second conductive layer 134, and the second conductive layer 134 may be closer to the user relative to the first conductive layer 132. In this way, the top view of the light emitting pixel [u2] is, for example, a view in the Z-axis direction and from the second conductive layer 134 toward the first conductive layer 132, but this disclosure is not limited thereto. In some embodiments, in the top view of the light emitting pixel, the area of the first main portion 132M of the first conductive layer 132 located below may be greater than the area of the second main portion 134M of the second conductive layer 134. In this way, the second main portion 134M can be fabricated on the first main portion 132M which has a larger area. It makes the second main portion 134M substantially flat and can provide a more uniform capacitive coupling effect, but this disclosure is not limited thereto. In other embodiments, the area of the first main portion 132M of the first conductive layer 132 may be equal to or smaller than the second main portion 134M of the second conductive layer 134 according to design requirements.

In the top view of the light emitting pixel, the first connection portion 132C may not overlap any of the second connection portions 134C. In this way, the first connection portion 132C may be exposed in the top view of the light emitting pixel. In the bottom view of the light emitting pixel (for example, viewing the light emitting pixel in the Z-axis direction and from the first conductive layer 132 located below to the second conductive layer 134), the second connection portion 134C may be exposed in the bottom view of the light emitting pixel. Specifically, when viewing the light emitting pixel in the Z-axis direction, the first connection portion 132C and the second connection portion 134C can be staggered from each other without overlapping, it helps to repair the storage capacitor 130.

Figure 6:
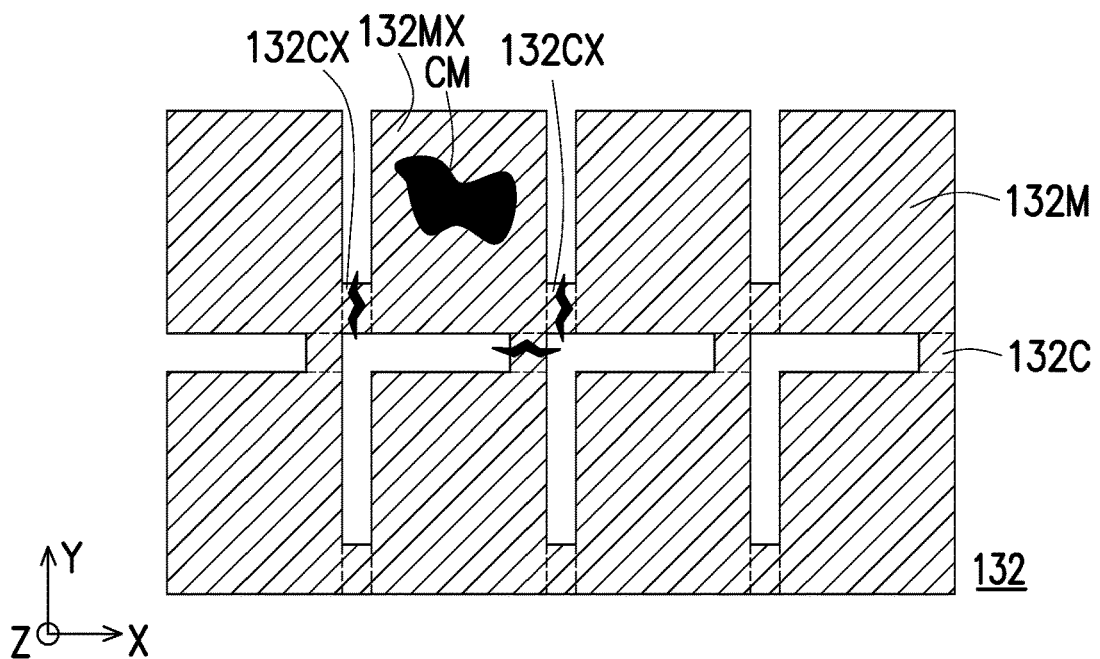
FIG. 6 to FIG. 8 schematically illustrate the repair of the storage capacitor according to an embodiment of the disclosure.
Figure 7:
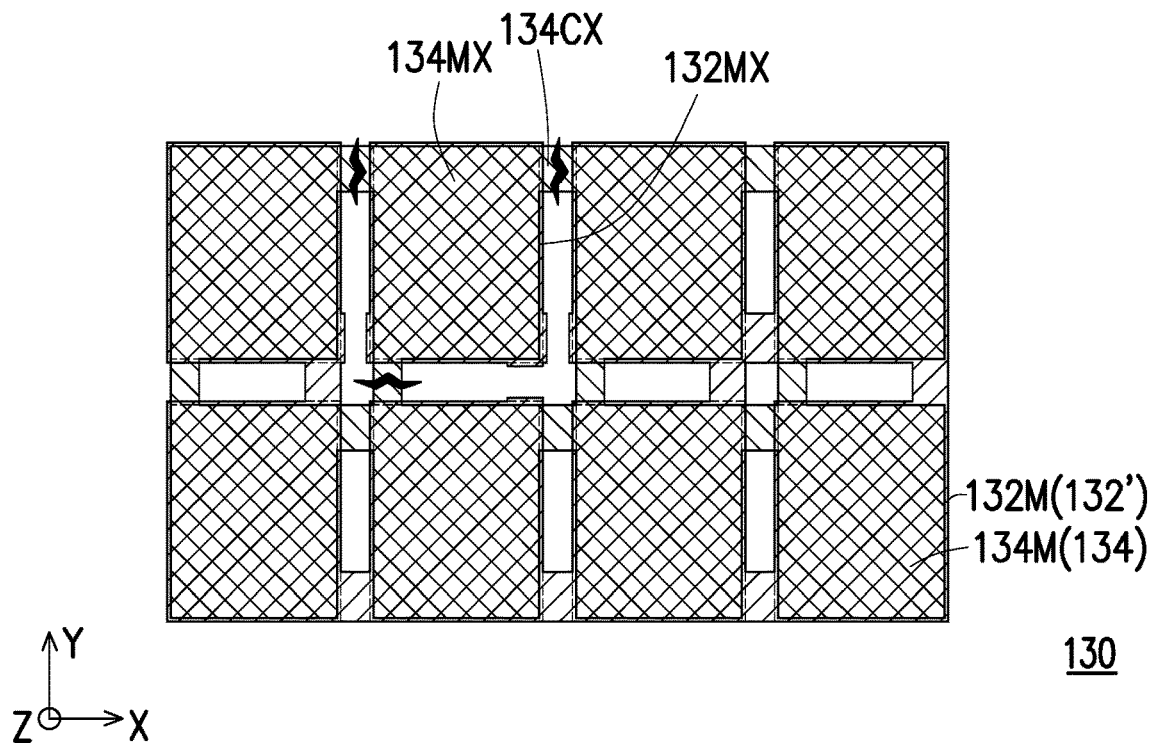
Figure 8:
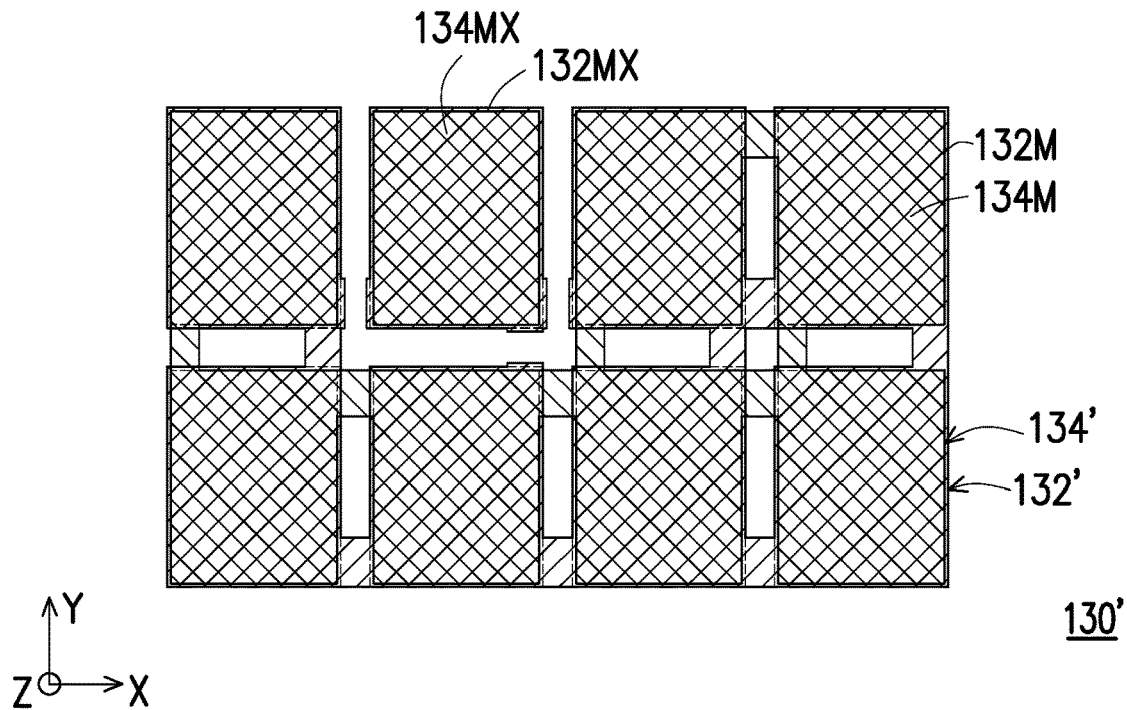

FIG. 6 to FIG. 8 schematically illustrate the repair of the storage capacitor according to an embodiment of the disclosure. As shown in FIG. 6, from the step of manufacturing the first conductive layer 132 to the step of manufacturing the second conductive layer 134, there may be a damaged portion CM located in the at least one first main portion 132M (such as the first main portion 132MX in FIG. 6) of the first conductive layer 132. It should be noted that in this disclosure, the damaged portion CM may appear due to the abnormal accumulation of materials in the manufacturing process, the abnormal shortage of materials, foreign particles and the like, or the holes caused by the etching process and other factors, but this disclosure is not limited thereto. Such damaged portion CM may cause failure of the capacitor, for example, causing the first main portion 132MX and the subsequently formed second conductive layer 134 to be electrically connected to each other and resulting in undesired short circuit. Therefore, if a damaged portion CM is found during the manufacturing process, repair may be carried out on the first conductive layer 132 firstly. In some embodiments, the method of repairing the first conductive layer 132 may include disconnecting the first connection portion 132CX connected to the first main portion 132MX. For example, the method of disconnecting includes performing laser cutting, mechanical cutting, etc. on the corresponding first connection portion 132CX. After disconnecting the corresponding first connection portion 132CX, the first main portion 132MX with the damaged portion CM is not connected to other first main portions 132M.

Next, as shown in FIG. 7, after the second conductive layer 134 is formed on the repaired first conductive layer 132', the second main portion 134MX corresponding to the first main portion 132MX may be electrically connected to the first main portion 132MX through the damaged portion CM. Therefore, the repair may also be carried out on the second conductive layer 134. For example, the second connection portion 134CX of the second main portion 134MX corresponding to the first main portion 132MX can be disconnected by laser cutting, mechanical cutting, etc., and the second connection portion 134CX connected to the second main portion 134MX is completely disconnected. As such, the second main portion 134MX will not be connected to other second main portions 134M. However, this disclosure is not limited thereto. In some embodiments, the second connection portion 134CX corresponding to the second main portion 134MX may be selectively not disconnected.

In FIG. 8, the repaired storage capacitor 130' may include a repaired first conductive layer 132' and a repaired second conductive layer 134'. The first conductive layer 132' may include a plurality of first main portions 132M connected together and the first main portion 132MX separated by repair. Furthermore, the second conductive layer 134' may include a plurality of second main portions 134M connected together and the second main portion 134MX separated by repair. In this way, the first main portion 132M connected together and the second main portion 134M connected together can still provide the function of the storage capacitor 130'. Therefore, the portion where the damaged portion CM is generated during the manufacturing process can be isolated without affecting the function of the storage capacitor 130'. In other words, the light emitting pixel with the storage capacitor 130' will not fail due to the presence of the damaged portion CM, thereby improving the yield of the light emitting pixel. In addition, FIG. 6 to FIG. 8 schematically show one aspect of the damaged portion CM appeared on one of the first main portions 132MX, but the disclosure is not limited thereto. In other possible embodiments, the damaged portions CM may occur on more than one first main portion 132M, and the repair may be carried out on the first main portions 132M and/or corresponding second main portions 134M with the damaged portions CM. Furthermore, the damaged portion CM may be generated during the manufacturing of the first conductive layer 132', or may be generated during the manufacturing of the insulating layer between the first conductive layer 132' and the second conductive layer 134'.

Figure 9:
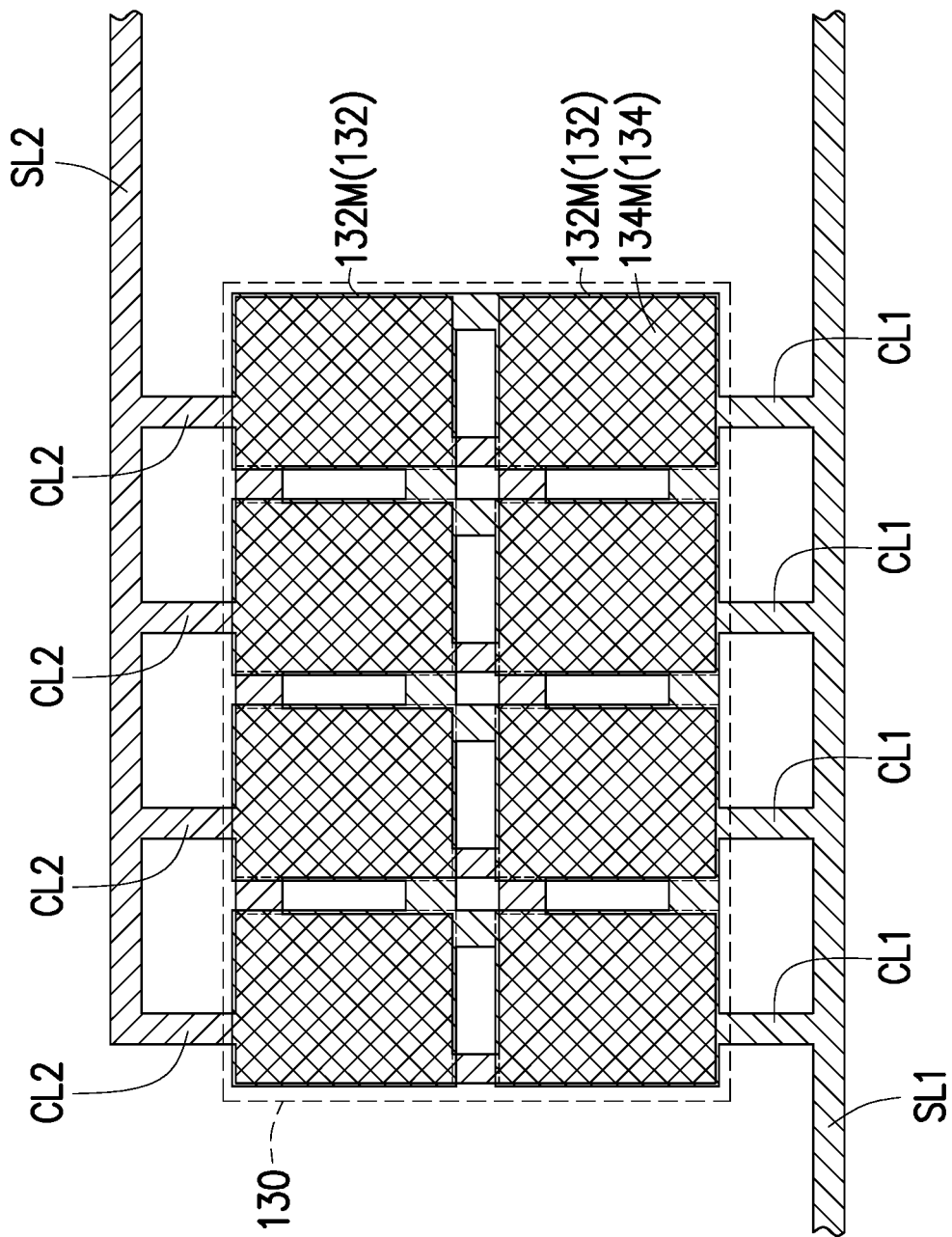
FIG. 9 is a schematic view of the wiring of the storage capacitor according to an embodiment of the disclosure.

FIG. 9 is a schematic view of the wiring of the storage capacitor according to an embodiment of the disclosure. In FIG. 9, the structure of the storage capacitor 130 can be derived from the description of the foregoing embodiment, and repetition is not narrated herein. The storage capacitor 130 may include the first conductive layer 132 and the second conductive layer 134. The first main portions 132M of the first conductive layer 132 are arranged in a 2×4 array, and the second main portions 134M of the second conductive layer 134 are also arranged in a 2×4 array, for example, but this disclosure is not limited thereto. In FIG. 9, the first conductive layer 132 may be connected to the first signal line SL1, and the second conductive layer 134 may be connected to the second signal line SL2. Specifically, the first conductive layer 132 is connected to the first signal line SL1 through a plurality of first connection lines CL1, and the second conductive layer 134 is connected to the second signal line SL2 through a plurality of second connection lines CL2. In the storage capacitor 130 and the wiring of FIG. 9, one of the first signal line SL1 and the second signal line SL2 may be a trace connected to the power supply Vdd in the light emitting pixel 100 of FIG. 1, and the other may be a trace connected to the first terminal 122 of the driving transistor 120 in the light emitting pixel 100 of FIG. 1. In this embodiment, the first conductive layer 132 may be connected to the first signal line SL1 through a plurality of first connection lines CL1, and the second conductive layer 134 may be connected to the second signal line SL2 through a plurality of second connection lines CL2, which increases the signal transmission path of the storage capacitor 130 and helps to ensure the signal transmission of the storage capacitor 130. However, in other embodiments, the wiring of the storage capacitor 130 may be designed in different ways when considering different factors.

Figure 10:
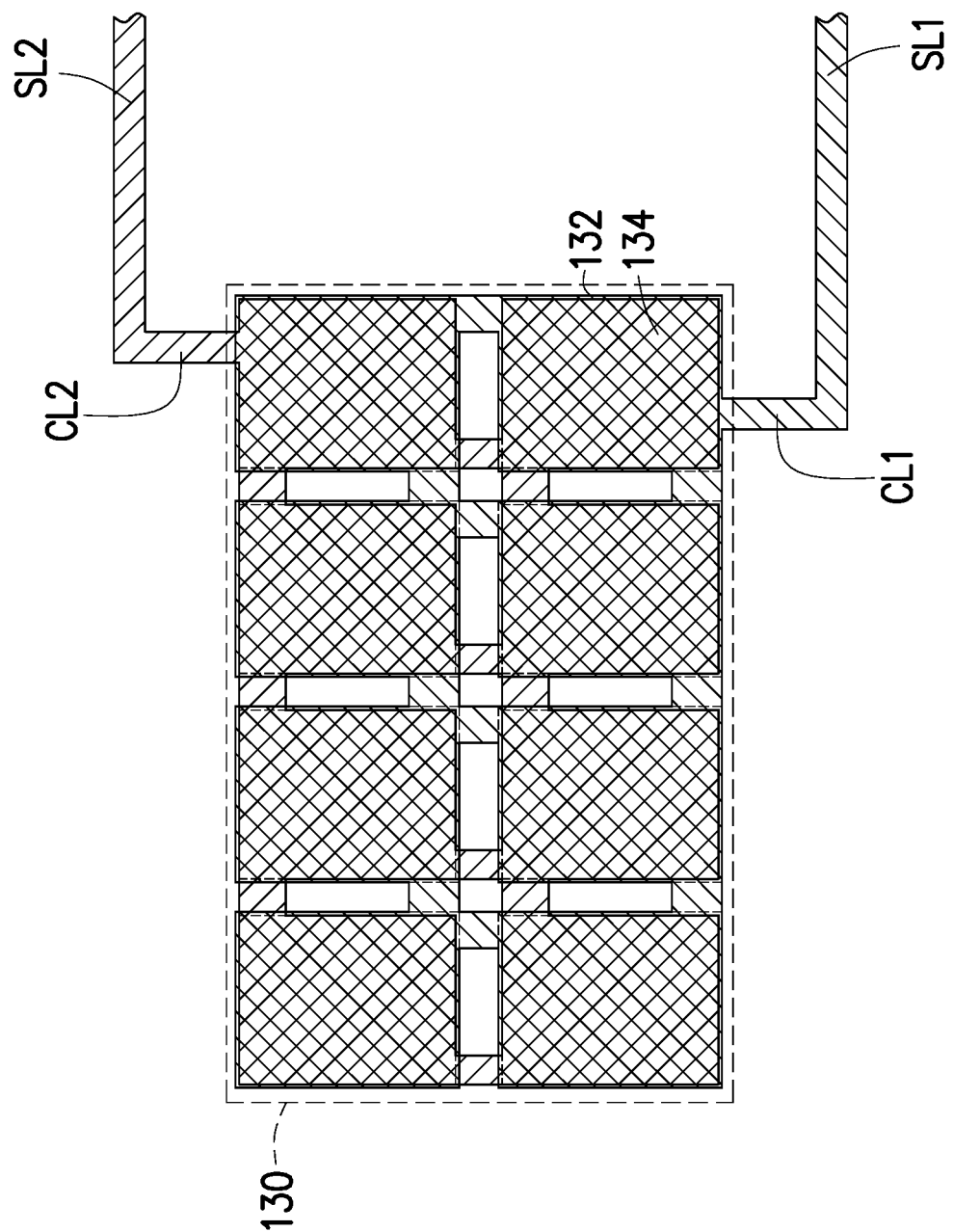
FIG. 10 is a schematic view of the wiring of the storage capacitor according to an embodiment of the disclosure.

FIG. 10 is a schematic view of the wiring of the storage capacitor according to an embodiment of the disclosure. In FIG. 10, the structure of the storage capacitor can be derived from the description of the foregoing embodiment, and repetition is not narrated herein. The storage capacitor 130 may include the first conductive layer 132 and the second conductive layer 134. Moreover, the first conductive layer 132 may be connected to the first signal line SL1 through the first connection line CL1, and the second conductive layer 134 may be connected to the second signal line SL2 through the second connection line CL2. One of the first signal line SL1 and the second signal line SL2 may be a trace connected to the power supply Vdd in the light emitting pixel 100 of FIG. 1, and the other may be a trace connected to the first terminal 122 of the driving transistor 120 in the light emitting pixel 100 of FIG. 1. In this embodiment, the number of the first connection line CL1 and the second connection line CL2 can be one, respectively, it helps to simplify the circuit layout of the storage capacitor 130 and make the circuit design of the light emitting pixel more flexible. However, it should be noted that, in FIG. 9 and FIG. 10, the number of the first connection line CL1 and the second connection line CL2 is the same, but the disclosure is not limited thereto. In some embodiments, the number or the circuit layout of the first connection lines CL1 and the number or the circuit layout of the second connection lines CL2 can be different.

In summary, in the light emitting pixel of the embodiment of the disclosure, the conductive layer of the storage capacitor includes a plurality of main portions connected through the connection portions, and the connection portions of the conductive layers of different layers do not overlap each other in a top view or a bottom view. When needed, the storage capacitor can be easily repaired, which helps to improve the yield of light emitting pixel.

Finally, it should be noted that the above embodiments are only used to illustrate the technical solution of the disclosure, rather than limit it. Although the disclosure has been described in detail with reference to the foregoing embodiments, those of ordinary skill in the art should understand that: the technical solutions described in the foregoing embodiments can still be modified, or some or all of the technical features can be equivalently replaced or combined, and these modifications, replacements or combinations do not deviate the nature of the corresponding technical solutions from the scope of the technical solutions in the embodiments of the disclosure.

What is claimed is:

1. An electronic device, comprising a light emitting pixel, and the light emitting pixel comprising:
   a light emitting unit;
   a driving transistor configured for controlling a driving current passing through the light emitting unit; and
   a storage capacitor electrically connected to the driving transistor and comprising a first conductive layer and a second conductive layer, wherein the first conductive layer and the second conductive layer are electrically isolated from each other, the first conductive layer comprises a plurality of first main portions connected through at least one first connection portion, and the second conductive layer comprises a plurality of second main portions connected through at least one second connection portion;

wherein in a top view of the light emitting pixel, one of the plurality of first main portions overlaps one of the plurality of second main portions.

2. The electronic device according to claim 1, wherein in the top view of the light emitting pixel, the at least one first connection portion does not overlap the at least one second connection portion.

3. The electronic device according to claim 1, wherein the first conductive layer is located under the second conductive layer, and the at least one first connection portion is exposed in the top view of the light emitting pixel.

4. The electronic device according to claim 1, wherein the first conductive layer is located under the second conductive layer, and the at least one second connection portion is exposed in a bottom view of the light emitting pixel.

5. The electronic device according to claim 1, wherein adjacent two of the plurality of first main portions are connected through at least one of the at least one first connection portion.

6. The electronic device according to claim 1, wherein adjacent two of the plurality of second main portions are connected through at least one of the at least one second connection portion.

7. The electronic device according to claim 1, wherein adjacent two of the plurality of first main portions are separated by a space.

8. The electronic device according to claim 1, wherein adjacent two of the plurality of second main portions are separated by a space.

9. The electronic device according to claim 1, wherein one of the first conductive layer and the second conductive layer is electrically connected to a first terminal of the driving transistor, the other one of the first conductive layer and the second conductive layer is electrically connected to a second terminal of the driving transistor, and the light emitting unit is electrically connected to a third terminal of the driving transistor.

10. The electronic device according to claim 9, wherein the second terminal of the driving transistor is electrically connected to a power supply.

11. The electronic device according to claim 1, wherein the light emitting unit comprises a light emitting diode.

12. The electronic device according to claim 1, wherein adjacent two of the plurality of first main portions are separated by a space, and at least one of the at least one first connection portion is located in the space.

13. The electronic device according to claim 1, wherein adjacent two of the plurality of second main portions are separated by a space, and at least one of the at least one second connection portion is located in the space.

14. The electronic device according to claim 1, wherein an area of the one of the plurality of first main portions is greater than an area of the one of the plurality of second main portions.

15. The electronic device according to claim 1, wherein the at least one first connection portion and the at least one second connection portion are staggered from each other without overlapping.

16. The electronic device according to claim 1, wherein at least one of the at least one first connection portion is disconnected.

17. The electronic device according to claim 1, wherein at least one of the at least one second connection portion is disconnected.

18. The electronic device according to claim 1, wherein the first conductive layer is connected to a first signal line through a plurality of first connection lines, and the second conductive layer is connected to a second signal line through a plurality of second connection lines.

19. The electronic device according to claim 18, wherein one of the first signal line and the second signal line is a trace connected to a power supply.

20. The electronic device according to claim 18, a number of the plurality of first connection lines and a number of the plurality of second connection lines are different.

* * * * *